(12) United States Patent
Sun et al.

(10) Patent No.: US 12,713,740 B2
(45) Date of Patent: Aug. 18, 2026

(54) MICRO LIGHT-EMITTING DIODE TRANSFER DEVICE AND METHOD OF TRANSFERRING THEREOF

(71) Applicant: TCL CHINA STAR OPTOELECTRONICS TECHNOLOGY CO., LTD., Shenzhen (CN)

(72) Inventors: Zhaoning Sun, Shenzhen (CN); Chaode Mo, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 876 days.

(21) Appl. No.: 17/272,312

(22) PCT Filed: Dec. 30, 2020

(86) PCT No.: PCT/CN2020/141553
§ 371 (c)(1),
(2) Date: Sep. 26, 2023

(87) PCT Pub. No.: WO2022/141236
PCT Pub. Date: Jul. 7, 2022

(65) Prior Publication Data

US 2024/0038939 A1 Feb. 1, 2024

(30) Foreign Application Priority Data

Dec. 29, 2020 (CN) ........................ 202011596387.3

(51) Int. Cl.
*H01L 33/50* (2010.01)
*H10H 20/00* (2025.01)
(Continued)

(52) U.S. Cl.
CPC ........ *H10H 20/851* (2025.01); *H10H 20/062* (2025.01); *H10H 20/036* (2025.01)

(58) Field of Classification Search
None
See application file for complete search history.

(56) References Cited

U.S. PATENT DOCUMENTS 8,056,222 B2 * 11/2011 Pique .................... H05K 1/183 29/832
9,306,117 B2 * 4/2016 Wu ........................ H10H 20/01
(Continued)

FOREIGN PATENT DOCUMENTS

CN 1376661 A 10/2002
CN 107305915 A 10/2017
(Continued)

OTHER PUBLICATIONS

International Search Report in International application No. PCT/CN2020/141553, mailed on Oct. 9, 2021.
(Continued)

*Primary Examiner* — Long Pham
(74) *Attorney, Agent, or Firm* — PV IP PC; Christopher S. Ruprecht; Wei Te Chung

(57) ABSTRACT

A micro light-emitting diode transfer device and a method of transferring thereof are provided. The micro light-emitting diode transfer device includes an operating board, a light source generator, and a photomagnetic substrate. The light source generator is disposed above the operating board and includes a plurality of light emitting units, each of the light emitting units comprises a light emitting side, and the light emitting side faces the operating board. The photomagnetic substrate includes a plurality of photomagnetic units, which attract micro light-emitting diodes.

7 Claims, 2 Drawing Sheets

(51) Int. Cl.

| | |
|---|---|
| ***H10H 20/851*** | (2025.01) |
| *H10H 20/01* | (2025.01) |

(56) References Cited

U.S. PATENT DOCUMENTS

| | | | | |
|---|---|---|---|---|
| 11,508,604 | B2 * | 11/2022 | Fan | H10H 20/01 |
| 11,996,495 | B2 * | 5/2024 | Wei | H10H 29/03 |
| 2011/0151588 | A1 | 6/2011 | Ashdown et al. | |
| 2020/0161159 | A1 * | 5/2020 | Park | H10P 72/0446 |
| 2020/0194616 | A1 * | 6/2020 | Henley | H10H 20/01 |

FOREIGN PATENT DOCUMENTS

| | | | |
|---|---|---|---|
| CN | 109411392 | A | 3/2019 |
| CN | 109548396 | A | 3/2019 |
| CN | 110335844 | A | 10/2019 |
| CN | 110350063 | A | 10/2019 |

OTHER PUBLICATIONS

Written Opinion of the International Searching Authority in International application No. PCT/CN2020/141553, mailed on Oct. 9, 2021.

Chinese Office Action in corresponding Chinese Patent Application No. 202011596387.3 dated Apr. 6, 2022, pp. 1-11.

* cited by examiner

MICRO LIGHT-EMITTING DIODE TRANSFER DEVICE AND METHOD OF TRANSFERRING THEREOF

RELATED APPLICATIONS

This application is a Notional Phase of PCT Patent Application No. PCT/CN2020/141553 having international filing date of Dec. 30, 2020, which claims the benefit of priority of Chinese Patent Application No. 202011596387.3 filed on Dec. 29, 2020. The contents of the above applications are all incorporated by reference as if fully set forth herein in their entirety.

FIELD OF INVENTION

The present invention relates to a field of semiconductor display manufacturing, and more particularly, to a micro light-emitting diode transfer device and a method of transferring thereof.

DESCRIPTION OF PRIOR ART

Micro light-emitting diodes (micro LEDs) are light-emitting diode having a micrometer size. Due to the small size of micro LEDs, they can be used as pixels on a display panel. The display panel made of the micro LED can be called a micro LED display panel. Compared to organic light-emitting diode (OLED) display panels, micro LED display panels have better service life and viewing angles than the OLED display panels. Therefore, micro LED display technology has been focused in the current display technology field.

The micro LED display panel includes an array substrate and a plurality of micro LEDs arrayed on the array substrate, and each micro LED can be regarded as a pixel. In related technologies, mass transfer technology is usually used to transfer the micro LED to the array substrate, and the micro LED chip is soldered to the array substrate, so the micro LED display panel is finally completed.

The requirement for mass transfer is to accurately split micron-level, hundreds of thousands or even millions of micro LED wafer chips from the donor wafer and transfer them to the target substrate (display array substrate) in an orderly manner. Currently, the mainly laser heating release technology or laser lift-off technology requires the use of lasers to pass through the transparent transfer substrate to cause simple physical deformation or chemical reactions of photosensitive materials to separate the chip from the wafer.

Technical Problem

However, the laser damage to the substrate and the heat damage to the wafer cannot be avoided, and it cannot be reused, and reduces service life.

SUMMARY OF INVENTION

Technical Solution

A micro light-emitting diode transfer device and a method of transferring thereof are provided, so as to solve the problem that the transfer device in the prior art damages the substrate and the wafer.

A micro light-emitting diode transfer device comprises: an operating board, wherein the operating board comprises a first platform configured to support an array substrate and a second platform configured to support a micro light-emitting diode; a light source generator disposed opposite to the operating board, wherein the light source generator comprises a plurality of light emitting units, each of the light emitting units comprises a light emitting side, and the light emitting side faces the operating board; and a photomagnetic substrate comprising a plurality of photomagnetic units. The photomagnetic substrate is disposed on the light emitting side of the light source generator, and each of the light emitting units corresponds to one of the photomagnetic units. When the photomagnetic units receive light, the photomagnetic units generate magnetism to attract the micro light-emitting diode, and when the photomagnetic unit do not receive light, the photomagnetic units lose the magnetism and release the micro light-emitting diode.

In one embodiment, the micro light-emitting diode transfer device further comprises a plurality of light wave filters disposed between each of the light emitting units and each of the photomagnetic units corresponding to each of the light emitting units.

In one embodiment, the light source generator comprises a light source and a transparent plate.

The light source comprises a light emitting side. The transparent plate comprises a plurality of light-transmitting regions and a light-shielding region surrounding the light-transmitting regions. The transparent plate is disposed on the light emitting side of the light source.

In one embodiment, the photomagnetic substrate comprises a transfer substrate, a photomagnetic material layer, and a plurality of magnetic channels.

The transfer substrate is parallel to the light source generator. The photomagnetic material layer is disposed on a side of the transfer substrate facing the light source generator and located in the photomagnetic units.

Each of the magnetic channels corresponds to one of the photomagnetic units, and the magnetic channels are filled with magnetic material. An attraction force generated by the magnetic channels is less than a gravity of the micro light-emitting diode.

In one embodiment, a wavelength of light waves emitted by the light source generator ranges from 10 nanometers to 800 nanometers.

An arrangement of the light emitting units is identical to an arrangement of pixels in the array substrate.

In one embodiment, the micro light-emitting diode transfer device further comprises a controller connected to the light source generator and configured to control turning on and off of the light source generator and an intensity of light waves emitted by the light source generator.

In one embodiment, the micro light-emitting diode transfer device further comprises a moving module connected to the light source generator and the photomagnetic substrate and configured to move the light source generator and the photomagnetic substrate at a same time.

A method of transferring a micro light-emitting diode comprises following steps:

preparing an array substrate and the micro light-emitting diode on an operating board; moving a light source generator and a photomagnetic substrate above the micro light-emitting diode; turning on the light source generator to cause the photomagnetic substrate to generate magnetism and attract the micro light-emitting diode; moving the light source generator and the photomagnetic substrate above the array substrate and turning down or turning off light waves emitted by the light source generator, so that the micro light-emitting diode falls from the photomagnetic substrate to the array substrate.

In one embodiment, the method further comprises: after moving the light source generator and the photomagnetic substrate above the micro light-emitting diode, aligning a photomagnetic unit in the photomagnetic substrate with the micro light-emitting diode; and after moving the light source generator and the photomagnetic substrate above the array substrate, aligning the photomagnetic substrate with the array substrate.

In one embodiment, the method further comprises: turning on a light source of the light source generator by a controller, wherein the light source generates light waves, and the light waves pass through a light wave filter into the photomagnetic substrate to excite the photomagnetic unit to generate magnetism and attract the micro light-emitting diode; and turning off or turning down light waves of by the controller, wherein the magnetism generated by the photomagnetic unit disappears or weakens, and attracted micro light-emitting diode is released.

Advantageous Effect

The present invention has beneficial effects described as follows. A micro light-emitting diode transfer device and a method of transferring thereof use the principle of photomagnetic effect to control the generation of magnetism, thereby controlling the attraction force of the device, and can perform massive transfer in a normal temperature environment, avoiding the conventional laser peeling from affecting the device thermal damage caused by components and micro light-emitting diodes, so it improves transfer efficiency and reduces production costs.

BRIEF DESCRIPTION OF DRAWINGS

In order to explain the technical solutions in the embodiments of the present invention more clearly, the following will briefly introduce the accompanying drawings needed in the description of the embodiments. Obviously, the accompanying drawings in the following description are merely some embodiments of the present invention. For those skilled in the art, other drawings can be obtained from these drawings without creative work.

Figure 1:
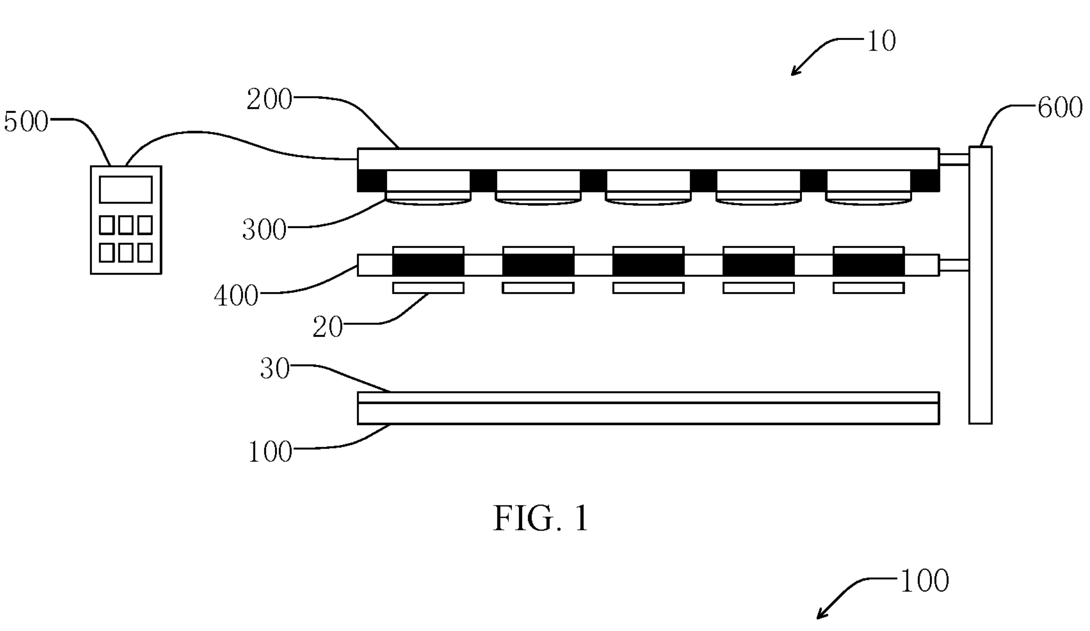
FIG. 1 is a schematic view of a layered structure of a micro light-emitting diode transfer device according to one embodiment of the present invention.

REFERENCE NUMERALS micro light-emitting diode transfer device 10;
micro light-emitting diode 20; array substrate 30;
operating board 100; first platform 110;
second platform 120; light source generator 200;
light emitting units 210; light emitting side 220;

light source 230; transparent plate 240;
light-transmitting region 241; light-shielding region 242;
light wave filter 300; photomagnetic substrate 400;
photomagnetic units 410; photomagnetic material layer 420;
transfer substrate 430; magnetic channels 431;
controller 500; moving device 600.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work are within the claimed scope of this application.

In the drawings, components with the same structure are represented by the same numerals, and components with similar structures or functions are represented by similar numerals. The size and thickness of each component shown in the drawings are arbitrarily shown, and the present invention does not limit the size and thickness of each component. In order to make the illustration clearer, the thickness of the components is appropriately exaggerated in some places in the drawings.

In addition, the following descriptions of the embodiments of the invention refer to the attached drawings to illustrate specific invention embodiments that the invention can be implemented. The directional terms mentioned in the present invention, for example, “up”, “down”, “front”, “back”, “left”, “right”, “inner”, “outer”, “side”, etc., merely refer to the direction of the attached drawings. Therefore, the directional terms used are for better and clearer description and understanding of the present invention, rather than indicating or implying that the device or element referred to must have a specific orientation or a specific orientation. The structure and operation cannot therefore be understood as a limitation of the present invention. In addition, the terms “first”, “second”, “third”, etc. are only used for descriptive purposes, and cannot be understood as indicating or implying relative importance.

When some part is described as being “on” another part, the part may be directly placed on the other part; there may also be an intermediate part on which the part is placed, And the middle part is placed on another part. When a component is described as “installed to” or “connected to” another component, both can be understood as directly “installed” or “connected”, or a component is indirectly “mounted to” or “connected to” through an intermediate component To” another part.

As shown in FIG. 1, a micro light-emitting diode transfer device 10 is provided. The micro light-emitting diode transfer device 10 comprises an operating board 100, a light source generator 200, and a photomagnetic substrate 400.

Figure 2:
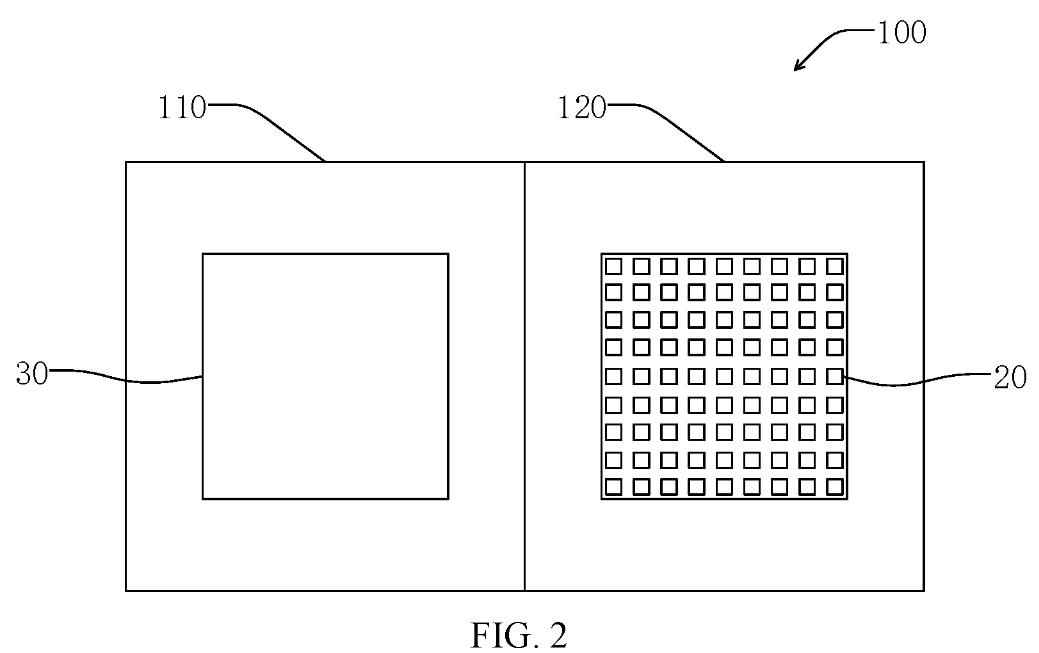
FIG. 2 is a top view of an operating board according to one embodiment of the present invention.

The operating board 100 comprises two working platforms: a first platform 110 and a second platform 120. As shown in FIG. 2, the first platform 110 is configured to support an array substrate 30, and the second platform 120 is configured to support a micro light-emitting diode 20.

Figure 3:
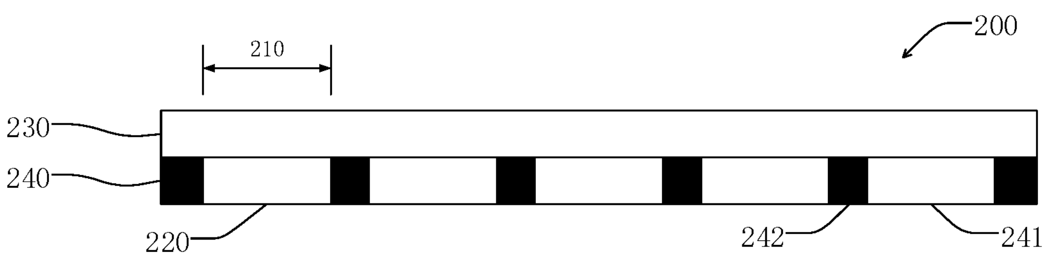
FIG. 3 is a schematic view of the layered structure of the light source generator according to one embodiment of the present invention.

As shown in FIG. 1 and FIG. 3, the light source generator 200 is disposed above the operating board 100. The light source generator 200 comprises a plurality of light emitting units 210, and each light emitting unit 210 can emit light waves with a wavelength of 10 nanometers to 800 nanometers. The light waves are emitted from a light emitting side 220 of the light emitting unit 210, and the light emitting side 220 faces the operating board 100. The light source generator 200 is configured to emit light waves to the photomagnetic substrate 400.

As shown in FIG. 3, the light source generator 200 comprises a light source 230 and a transparent plate 240. The light source 230 is configured to emit light waves to the light source generator 200. The light waves have a wavelength of 10 nanometers to 800 nanometers. The light emitting side 220 of the light source 230 is the same as the light emitting side 220 of the light emitting unit 210. The transparent plate 240 is disposed parallel to a surface of the operating board 100. The transparent plate 240 comprises a plurality of light-transmitting regions 241 and a plurality of light-shielding regions 242 surrounding the light-transmitting regions 241. Each light-transmitting region 241 is corresponding to a light emitting unit 210. The light waves emitted by the light source 230 passes through the light-transmitting region 241 of the transparent plate 240 to form a light emitting unit 210.

Figure 4:
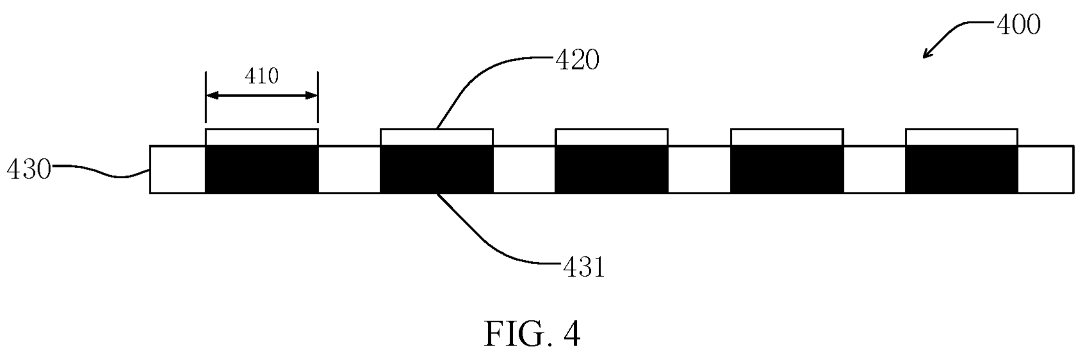
FIG. 4 is a schematic view of a layered structure of a photomagnetic substrate according to one embodiment of the present invention.

As shown in FIG. 1 and FIG. 4, The photomagnetic substrate 400 is disposed between the operating board 100 and the light source generator 200, and is located on the light emitting side 220 of the light source generator 200. The photomagnetic substrate 400 comprises a plurality of photomagnetic units 410, and each photomagnetic unit 410 corresponds to a light emitting unit 210. The light emitted by the light emitting unit 210 causes the photomagnetic unit 410 to generate magnetism so as to attract micro light-emitting diode 20. The arrangement of the light emitting unit 210 on the light source generator 200, the arrangement of the photomagnetic units 410 on the photomagnetic substrate 400, and the arrangement of pixels in the array substrate 30 of the micro light-emitting diode 20 are the same, so that each micro light-emitting diode 20 that are attracted and transferred can accurately fall on the corresponding pixel positions of the array substrate 30 after being released.

As shown in FIG. 4, the photomagnetic substrate 400 comprises a transfer substrate 430 and a photomagnetic material layer 420. The transfer substrate 430 is arranged parallel to the transparent plate 240. The photomagnetic material layer 420 is disposed on a surface of the transfer substrate 430 facing the light source generator 200, and each photomagnetic unit 410 comprises a photomagnetic material layer 420. The photomagnetic material layer 420 comprises a photomagnetic polymer material capable of generating a photomagnetic effect. Generally, the photomagnetic polymer material is a chelating polymer containing iron, cobalt, and nickel plasma. When the photomagnetic material layer 420 is exposed to light, the photomagnetic polymer material will have a photomagnetic effect, thereby generating magnetism, so that the photomagnetic substrate 400 can attract the micro light-emitting diode 20. When the photomagnetic material layer 420 is not exposed to light, the photomagnetic polymer material will not have the photomagnetic effect, and the generated magnetism will be lost. The photomagnetic substrate 400 will also have no magnetism, and the attracted micro light-emitting diode 20 can also be released.

As shown in FIG. 4, the transfer substrate 430 comprises a plurality of magnetic channels 431. The magnetic channels 431 penetrate through the transfer substrate 430 in a direction perpendicular to a surface of the transfer substrate 430 close to the light source generator 200, and the magnetic channels 431 are disposed corresponding to a photomagnetic unit 410. In each photomagnetic unit 410, the orthographic projections of the magnetic channels 431 and the photomagnetic material layer 420 on the operating table 100 are overlapped. The magnetic channels 431 are filled with hard magnetic materials, such as ferrite materials, metal compounds, etc. The magnetic channels 431 have weak magnetism, and the attraction force generated by the magnetic channels 431 is less than the gravity of the transferred micro light-emitting diode 20, so the magnetism of the magnetic channel 431 cannot attract the micro light-emitting diode 20. The magnetic channels 431 are configured to strengthen the magnetism of the photomagnetic material layer 420, so as to increase the magnetism of the photomagnetic substrate 400, increase the attraction force of the photomagnetic substrate 400 to the micro light-emitting diode 20, and improve the stability during device transfer.

As shown in FIG. 1, the micro light-emitting diode transfer device 10 also comprises a light wave filter 300, a controller 500, and a moving device 600. The light wave filter 300 is disposed between the light source generator 200 and the photomagnetic substrate 400, and each of light emitting units 210 is correspondingly provided with a light wave filter 300. The light wave filter 300 is configured to filter light waves, so as to provide more stable light waves for the photomagnetic substrate 400, and thus it improves the efficiency of photomagnetic conversion. The controller 500 is connected to the light source generator 200 and is configured to turn on, turn off, and strength of the light source 230 in the light source generator 200, so as to control the magnetism of the photomagnetic substrate 400. The moving device 600 is connected to the light source generator 200 and the photomagnetic substrate 400, and is configured to move the light source generator 200 and the photomagnetic substrate 400 back and forth between the first platform 110 and the second platform 120 of the of the operating board 100.

Figure 5:
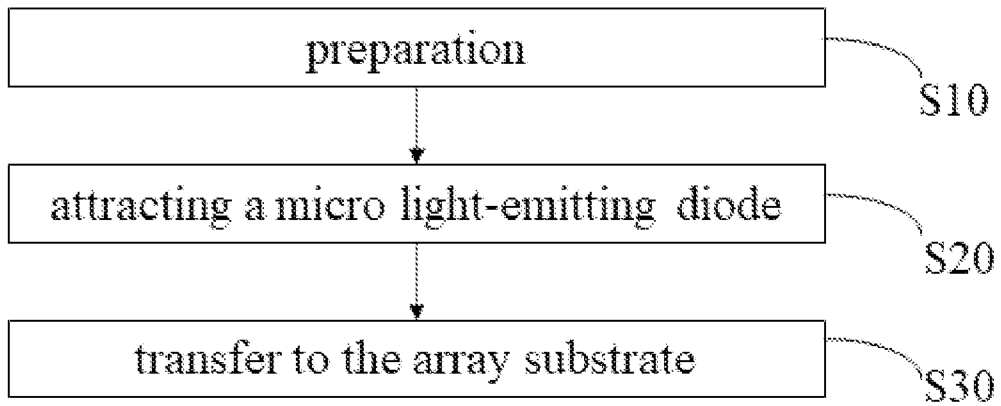
FIG. 5 is a transfer flow chart of a method of transferring the micro light-emitting diode according to embodiment of the present invention.

The embodiment of the present invention also provides a method of transferring the micro light-emitting diode 20 by using the aforementioned micro light-emitting diode transfer device 10. The transfer process of the method is shown in FIG. 5. The method comprises following steps:

Step S10) preparation: preparing an array substrate 30 on the first platform 110 of the operating board 100, and preparing a wafer with the micro light-emitting diode 20 on the second platform 120 of the operating board 100.

Step S20) attracting a micro light-emitting diode 20: the light source generator 200 and the photomagnetic substrate 400 are moved above the second platform 120 by the moving device 600, and aligned with the micro light-emitting diode 20, so that each photomagnetic unit 410 on the photomagnetic substrate 400 corresponds to one micro light-emitting diode 20. The light source generator 200 is turned on by the controller 500, so that each light emitting unit 210 emits light waves and irradiates the corresponding photo-magnetic unit 410, so that each photo magnetic unit 410 has a photo-magnetic effect to generate magnetism, thereby attracting the micro light-emitting diode 20 on the wafer.

Step S30) transfer to the array substrate 30: the light source generator 200 is kept open, and the moving device 600 moves the light source generator 200 and the photomagnetic substrate 400 to the first platform 110, and at the same time. At the same time, the micro light-emitting diode 20 attracted by the photomagnetic substrate 400 is also moved to the first platform 110. The photomagnetic substrate 400 and the array substrate 30 are aligned, so that each photomagnetic unit 410 on the photomagnetic substrate 400 corresponds to a pixel on the array substrate 30. The light wave emitted by the light source generator 200 is weakened or turned off by the controller 500, so that the magnetism of the photomagnetic substrate 400 is weakened or disappeared, and the attraction force is less than the gravity of the micro light-emitting diode 20. Therefore, the micro light-emitting diode 20 cannot be attracted and the micro light-emitting diode 20 falls down. Since the photomagnetic substrate 400 has been aligned with the array substrate 30, each attracted micro light-emitting diode 20 on the photomagnetic substrate 400 corresponds to the pixel position of the array substrate 30 to complete the transfer.

The micro light-emitting diode transfer device 10 in the embodiment of the present invention can perform massive transfer and effectively release at room temperature, avoiding thermal damage to the transfer substrate 430 and the micro light-emitting diode 20 caused by conventional laser lift-off methods, and the service life of the equipment components is improved, the transfer substrate 430 can also be reused, and the production cost is reduced. Also, the transfer method of the equipment has a simple operation process and is easy to operate, which can effectively improve the transfer efficiency.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A micro light-emitting diode transfer device, comprising:

an operating board, wherein the operating board comprises a first platform configured to support an array substrate and a second platform configured to support a micro light-emitting diode;

a light source generator disposed opposite to the operating board, wherein the light source generator comprises a plurality of light emitting units, each of the light emitting units comprises a light emitting side, and the light emitting side faces the operating board; and a photomagnetic substrate comprising a plurality of photomagnetic units;

wherein the photomagnetic substrate is disposed on the light emitting side of the light source generator, and each of the light emitting units corresponds to one of the photomagnetic units; and wherein when the photomagnetic units receive light, the photomagnetic units generate magnetism to attract the micro light-emitting diode, and when the photomagnetic unit do not receive light, the photomagnetic units lose the magnetism and release the micro light-emitting diode.

2. The micro light-emitting diode transfer device according to claim 1, further comprising a plurality of light wave filters disposed between each of the light emitting units and each of the photomagnetic units corresponding to each of the light emitting units.

3. The micro light-emitting diode transfer device according to claim 1, wherein the light source generator comprises:

a light source comprising a light emitting side; and a transparent plate comprising a plurality of light-transmitting regions and a light-shielding region surrounding the light-transmitting regions, wherein the transparent plate is disposed on the light emitting side of the light source.

4. The micro light-emitting diode transfer device according to claim 1, wherein the photomagnetic substrate comprises:

a transfer substrate parallel to the light source generator;

a photomagnetic material layer disposed on a side of the transfer substrate facing the light source generator and located in the photomagnetic units; and a plurality of magnetic channels, wherein each of the magnetic channels corresponds to one of the photomagnetic units, and the magnetic channels are filled with magnetic material;

wherein an attraction force generated by the magnetic channels is less than a gravity of the micro light-emitting diode.

5. The micro light-emitting diode transfer device according to claim 1, wherein a wavelength of light waves emitted by the light source generator ranges from 10 nanometers to 800 nanometers; and wherein an arrangement of the light emitting units is identical to an arrangement of pixels in the array substrate.

6. The micro light-emitting diode transfer device according to claim 1, further comprising:

a controller connected to the light source generator and configured to control turning on and off of the light source generator and an intensity of light waves emitted by the light source generator.

7. The micro light-emitting diode transfer device according to claim 1, further comprising a moving module connected to the light source generator and the photomagnetic substrate and configured to move the light source generator and the photomagnetic substrate at a same time.

* * * * *